ELECTRONIC SIGNAL SEEKING MEANS HAVING TUNING REACTANCE AUTOMATICALLY CONTROLLED BY DIFFERENCE BETWEEN CONCURRENT AND DELAYED DETECTOR OUTPUT

Filed July 31, 1961 2 Sheets-Sheet 1

RALPH M. SEELEY, Jr.
INVENTOR.

BY
V.C. Muller
ATTORNEY

Dec. 18, 1962 R. M. SEELEY, JR 3,069,637
ELECTRONIC SIGNAL SEEKING MEANS HAVING TUNING REACTANCE
AUTOMATICALLY CONTROLLED BY DIFFERENCE BETWEEN
CONCURRENT AND DELAYED DETECTOR OUTPUT
Filed July 31, 1961 2 Sheets-Sheet 2

RALPH M. SEELEY, Jr.
INVENTOR.

BY

ATTORNEY 3,069,637
Patented Dec. 18, 1962

3,069,637

ELECTRONIC SIGNAL SEEKING MEANS HAVING TUNING REACTANCE AUTOMATICALLY CONTROLLED BY DIFFERENCE BETWEEN CONCURRENT AND DELAYED DETECTOR OUTPUT

Ralph M. Seeley, Jr., Port Matilda, Pa., assignor, by mesne assignments, to the United States of America as represented by the Secretary of the Navy Filed July 31, 1961, Ser. No. 128,273
5 Claims. (Cl. 334—16)

This invention generally relates to tuning systems for wave receiving apparatus and the like and more particularly to tuning systems adapted to automatically select and tune upon the strongest signals within a tuning range.

Tuning systems for wave receivers and the like are known in the art. Such systems are often found in radio receivers which, by a mechanical drive system, tune the radio capacitors to the point of maximum signal. These devices also have uses in acoustical systems where it is desirable to tune upon and eliminate by filtering the effects of certain signals such as reverberation. Mechanical tuning systems generally have the disadvantage of mechanical bulk, slowness, inertial over-drive, wear, and so forth. The present device eliminates these disadvantages in that it is completely electronic, and hence not subject to the aspects of mechanical drive systems. In essence, this device provides an electronic variable capacitance actuated by an integrator circuit which is controlled by an ampltiude comparator. The amplitude comparator detects changes in the magnitude of incoming signals as a spectrum of frequencies is progressively tuned, and by means of a time delay circuit, which notes the ever changing instantaneous magnitude of the incoming signal, tunes upon the strongest signals.

It is therefore the object of this invention to provide an improved tuning system for wave receiving devices.

It is another object of this invention to provide a circuit adaptable in an accustic transmitting and receiving system capable of tuning upon and eliminating the effects of undesirable frequency spectrum.

It is another object of this invention to provide a wholly electronic variable capacitance tuning circuit capable of operation without mechanical drive systems.

It is still another object of this invention to provide an electronic tuning system which operates automatically to select strong signals within the tuning range of frequencies.

These and other objects of the invention may be seen by reference to the accompanying drawing in which.

Figure 1:
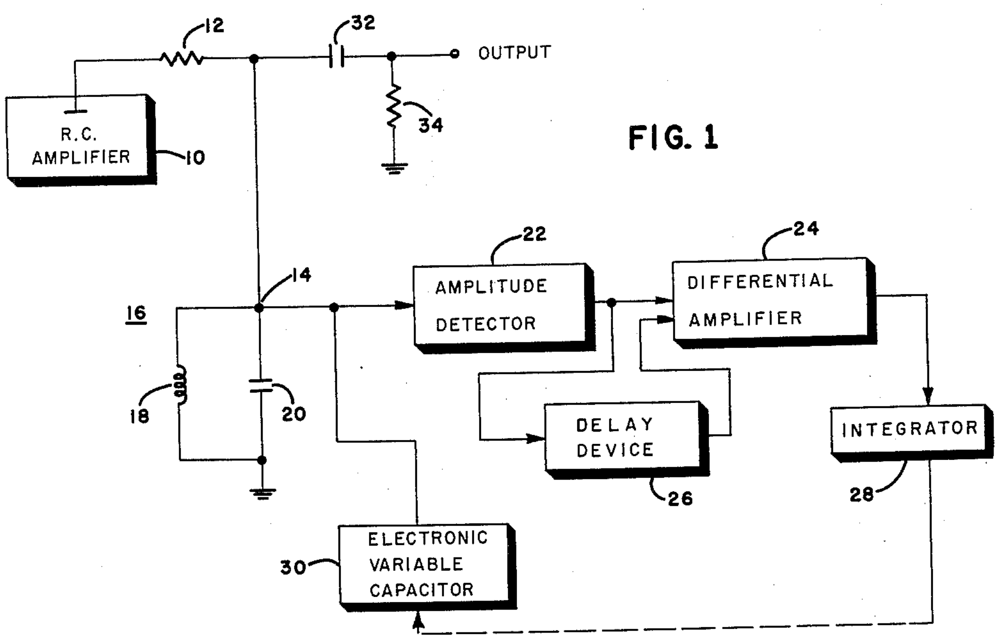
FIGURE 1 is a schematic block diagram of one embodiment of the essential elements of the tuning system of this invention.

Referring now to FIGURE 1, the block diagram of the tuning system in accordance with the principles of this invention is shown as receiving its input signal from R-F amplifier 10. It should be noted, however, that numerous other signal sources are contemplated, in particular, signals emanating from acoustic-direction-finding systems. Amplifier 10 of a conventional radio receiver whose signal passes through resistor 12 through junction 14 to resonant tank circuit 16 comprised of inductor 18 and capacitor 20, connected in parallel, to ground. The signal from the R-F tank circuit 16 is transmitted to amplitude detector 22 which power-amplifies, rectifies and filters the incoming signal and transmits it to differential amplifier 24 and to delay device 26.

Delay device 26 is a conventional delay line circuit which delays its input signal a predetermined amount of time and then transmits this signal to differential amplifier 24. Differential amplifier 24 has an output which depends on the increase or decrease of the signal from detector 22. The output signal from the amplifier 24 is connected to integrator 28 having a direct current output signal whose polarity and amplitude are dependent upon the output of amplifier 24. Integrator 28 actuates connected electronic variable capacitor 30 to change its apparent capacity, and in so doing, changes the resonant frequency of connected tank circuit 16, actuating it to tune upon the signal band having the greatest amplitude. The output signal from the circuit passes from junction 14 through capacitor 32 and resistor 34 to ground. This output signal is tapped at the ungrounded terminal of resistor 34 in accordance with principles well known in the art.

Figure 2:
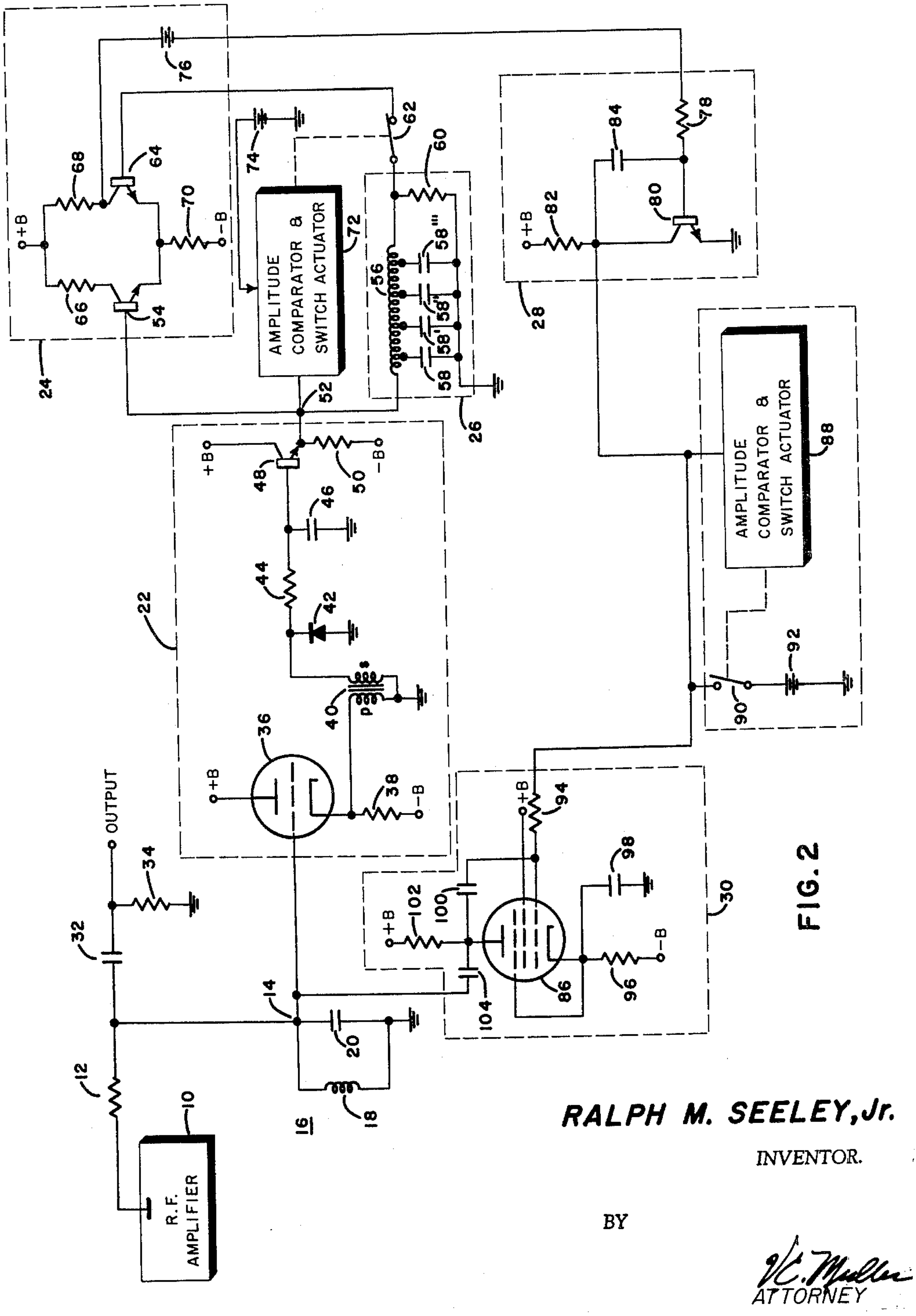
FIGURE 2 is a schematic circuit diagram of the device illustrated in FIGURE 1 with additional supporting elements added.

Referring now to FIGURE 2, the output from junction 14 is coupled to the grid of triode tube 36 located in detector 22. Triode 36 has its plate connected to a source of plus B voltage and its cathode coupled through cathode resistor 38 to a source of minus B voltage. The cathode 26 of this triode is connected through the primary winding of transformer 40 to ground. The secondary winding of transformer 40 is connected from ground to the plate of diode 42, whose cathode is grounded. The plate of diode 42 is coupled through resistor 44 to grounded condenser 46. Diode 42 in combination wtih resistance 44 and condenser 46 form a filtering circuit of a type well known in the art.

The ungrounded terminal of condenser 46 is then connected to the base of transistor 48, the collector of which is connected to a source of plus B voltage and the emitter connected through resistor 50 to a source of minus B voltage. The emitter of transistor 48 is then connected through junction 52 directly to the base of transistor 56 located in differential amplifier 24 and to delay device 26 whose output is also connected to differential amplifier 24.

Delay device 26 is a conventional delay-line type circuit comprised of inductor 56 which is tapped along its length by grounded capacitors 58, 58′, 58″, 58‴, and at its output by grounded resistor 60. This circuit operates in a conventional manner to delay by a predetermined amount of time the signal passing from the emitter of transducer 48 through switch 62 to the base of transistor 64 which is positioned in the differential amplifier 24. Differential amplifier 24 is of a conventional type comprised of transistor 54 and 64 whose collector terminals are connected through resistors 66 and 68, respectively to a source of plus B voltage, and whose emitters are connected together and through resistor 70 to a source of minus B voltage.

Junction 52 is also coupled to conventional bistable amplitude comparator and switch actuator 72 adapted to colse switch 62 only when the signal from the junction 52 is above a predetermined level designated by the connected grounded battery 74. Thus when the level of signal drops below this predetermined potential of battery 74, switch 62 opens interrupting the signal from delay device 26 to differential amplifier 24.

The collector of transistor 64 is connected through a negative biasing source, battery 76, to resistor 78 of integrator 28, and thence to the base of transistor 80. Integrator 28 is a conventional feedback device known in the art which produces an output voltage declining with time (negative slope) for a constant positive current input. The collector of transistor 80 is coupled through resistor 82 to a source of plus B voltage and the emitter is grounded. Capacitor 84 is connected between the collector of transistor 80 and its base.

The collector of transistor 80 is connected through resistor 94 to the control grid of reactance tube 86 and also to bistable amplitude comparator and switch actuator 88. Comparator 88 actuates to reset frequency bias switch 90 which is connected between the collector of transistor 80 and a source of reset bias, battery 92. Thus when the signal from the collector of transistor 80 reaches a predetermined level, switch 90 closes, connecting this collector terminal and the electronic variable capacitor 30 to this predetermined level of reset bias.

The collector terminal of transistor 80 is connected through resistor 94 to the control grid of reactance tube 86. The screen grid of tube 86 is connected to a source of plus B voltage and the suppressor grid coupled to the tube's cathode. The cathode is coupled through cathode resistor 96 to a source of minus B voltage and through capacitor 98 to ground. The plate of tube 86 is connected through capacitor 100 to the control grid and through resistor 102 to a source of plus B voltage. This plate is also connected through capacitor 104 to junction 14.

Figure 3:
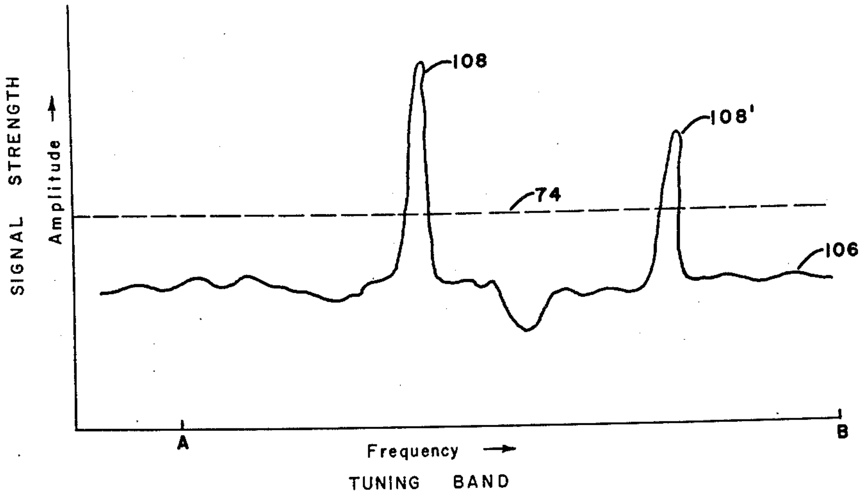
FIGURE 3 is a graph indicating the spectrum of frequencies upon which the present invention operates.

In operation, the resonant tuning frequency of the tank circuit 16 is varied so as to sweep a predetermined tuning band between points A and B of curve 74, FIGURE 3, in a manner hereinafter described. Curve 106 represents the transmitted energy spectrum of frequencies, as for example, a radio frequency broadcast band. Peaks 108 and 108′ might be the transmitting spectrum of radio broadcasting stations. The dotted line 74 representing the potential of battery 74, indicates the level above which switch 62 is closed by the actuator 72. If an energy level peak such as 108 is encountered in the course of the frequency tuning sweep, capacitor 30 will alter its capacity so as to cause the tuning circuit 16 to tune upon the peak's high point.

The radio frequency signal emanating from amplifier 10 coupled to tank circuit 16 is fed through triode 36 which acts as a conventional current amplifier and impedance isolating device. Transformer 40, acting through diode 42, rectifies the signal and clips its negative portion. The signal is then filtered through conventional filter circuit comprised of resistance 44 and grounded capacitor 46, and emerges as a positively fluctuating direct current. This passes through transistor 48, a conventional current amplifier and impedance isolating device, to junction 52.

The positive direct current fluctuating signal is then transmitted from junction 52 to the base of transistor 54 where it causes a current to flow from plus B voltage source through resistor 66 through transistor 54 and resistor 70 to the minus B current source. At this time, little or no current flows through resistor 68 and transistor 64. The voltage at the collector terminal of transistor 64 is thus nearly at plus B potential. In operation, the plus B source is larger than the battery 76, thus the voltage reaching the input of integrator 28 is positive.

The signal from junction 52 is also connected to delay device 26 which delays the signal a predetermined time interval in a manner well known in the art. Junction 52 is also connected to amplitude comparator and switch actuator 72 which closes switch 62 only when the incoming signal is equal to or greater than the predetermined voltage of battery 74, represented also by the dotted line in FIGURE 3. When the signal strength drops below this actuating voltage, switch 62 automatically opens, disconnecting delay device 26 from differential amplifier 24. Integrator 28 is a conventional feedback device, well known in the art, which when connected to a source of positive voltage will produce at its output a differential voltage having a negative slope (ramp voltage) or one declining with time. Conversely negative input voltage will produce a voltage increasing with time. The decreasing voltage produced, upon reaching the control grid of the electronic reactance tube 86, causes its apparent capacitance to lessen and hence, the resonating frequency of the connected tank circuit 16 to increase. A negative signal at the input of the integrator will cause the opposite result.

As soon as the peak of the energy spectrum 108 is tuned upon and the signal from junction 52 decreased, the delay device 26 delaying the previous higher positive voltage will cause the base of transistor 64 to become more positive than the base of transistor 54, hence, a greater current will flow through resistor 68 through transistor 64 and resistor 70 to the minus B source of voltage. The voltage drop through resistor 68 will reduce the plus B source of voltage connected to battery 76 so that negative voltage reaches the input of the integrator 28. The action of integrator 28 is such that with the negative input voltage, its voltage output will begin to increase with time in a manner previously described. This increasing voltage connected to electronic variable capacitor 30 will increase with time the capacitance of the tank circuit 16 and hence, cause its resonating frequency to lessen or to be swept back in the opposite direction. The peak of energy 108 will again be passed and the sweep will then again change direction. This process will continue indefinitely unless altered by an outside force. Thus, as may be seen, the resonant circuit 16 will tune upon the peak energy source 108 and remain so tuned.

Should the resonant circuit 16 encounter no energy peaks in the spectrum of curve 74 swept, it will continue to the end of the frequency spectrum. At this point, amplitude comparator and switch actuator 88 connected to the output of integrator 28 will sense minimum voltage and actuate switch 90 connecting variable capacitor 30 to battery 92. This will return capacitor 30, tank circuit 16, and integrator 28 to their initial starting frequency. At this point, the circuit again will begin to sweep across its spectum and repeat the process previously described.

If it is desired to tune upon another peak of transmitted energy, it is merely necessary to open switch 62 for a predetermined amount of time allowing the circuit to continue sweeping until the sweeping frequency is past the tuned frequency of the previous peak. The latter condition can be insured, if necessary, by adding a bistable multivibrator (not shown) whose set input is the "mode-jump" switch (not shown) and whose reset input is the output of amplitude comparator 22. This may be made to actuate another switch (not shown) in series with switch 62 so that the sweep will continue until the amplitude level of the previous peak falls below the voltage of battery 74.

Although this device has been described in terms of radio frequency tuning, it is also contemplated that this circuit will find use in acoustical instruments, particularly in acoustic direction-finding systems used in homing torpedoes. In such an application the signal, instead of originating from R-F amplifier 10, would come from acoustic transducers mounted in the head of a torpedo proceeding through the water. One mode of operation of such a torpedo is to produce an acoustic pulse, receive the echo as it returns the target, and to electronically process this echo so as to direct the torpedo to the target. The reverberating acoustic vibration from the emitted pulse frequency obscures the target's echo. Hence, it is desirable to filter out this reverberation. By a slight modification of the tank circuit 16, this device can be made to tune upon the peak of reverberation frequencies and to, by appropriate filter means, eliminate them from the electronic circuit so they do not interfere with the returning target echo.

Although the invention is described with a certain degree of particularity, it is understood that the present disclosure is by way of example only, and that numerous changes in design may be made without departing from the spirit and scope of the invention hereinafter claimed.

What is claimed is:

1. In an electronic signal-seeking device, the combination comprising: input terminals adapted to receive a frequency spectrum; a tuned circuit connected to said input terminals; an amplitude detector means coupled to said tuned circuit; a signal delay means connected to the output of said amplitude detector means; differential amplifier means coupled to the output of said amplitude detector means and to the output of said signal delay means whereby said differential amplifier means has an output signal of predetermined polarity dependent on the amplitude slope of said frequency spectrum; an integrator circuit connected to said differential amplifier means adapted to respond to the output polarity of said differential amplifier means; and a variable capacitance means responsive to the output of said integrator circuit and connected to said tuned circuit whereby the resonant frequency of said tuned circuit is varied in one direction when signals within said frequency spectrum are increasing in amplitude and in the opposite direction when signals within said frequency spectrum are decreasing in amplitude.

2. The combination in claim 1 in which said integrator circuit varies said variable capacitance in one direction when the output of said differential amplifier is of one polarity and in an opposite direction when output of said differential amplifier is of the opposite polarity.

3. The combination in claim 2 having means whereby the resonant frequency of said tuned circuit is caused to vary in a predetermined direction.

4. The combination in claim 3 having means whereby the resonant frequency of said tuned circuit sweeps and resweeps said frequency spectrum until said spectrum varies in amplitude above a predetermined level.

5. The combination in claim 4 in which said tuned circuit is comprised of an inductance and a capacitance.

No references cited.